(12) United States Patent
Buda et al.

(10) Patent No.: US 6,882,670 B2
(45) Date of Patent: Apr. 19, 2005

(54) LOW DIVERGENCE DIODE LASER

(75) Inventors: Manuela Buda, Canberra (AU); Hark Hoe Tan, Grarran (AU); Michael Francis Aggett, Melba (AU); Chennupati Jagadish, Evatt (AU)

(73) Assignee: The Australian National University, Australian Capital Territory (AU)

( * ) Notice: Subject to any disclaimer, the term of this patent is extended or adjusted under 35 U.S.C. 154(b) by 0 days.

(21) Appl. No.: 10/406,804

(22) Filed: Apr. 3, 2003

(65) Prior Publication Data

US 2004/0013147 A1 Jan. 22, 2004

(30) Foreign Application Priority Data

Apr. 3, 2002 (AU) ........................ PS 1507/02

(51) Int. Cl.⁷ ................................ H01S 5/00
(52) U.S. Cl. .......................... 372/45; 372/46
(58) Field of Search ...................... 372/43–50

(56) References Cited

U.S. PATENT DOCUMENTS

| | | | | |
|---|---|---|---|---|
| 4,328,469 A | * | 5/1982 | Scifres et al. ................. | 372/45 |
| 5,197,077 A | | 3/1993 | Harding et al. .............. | 372/45 |
| 5,260,959 A | | 11/1993 | Hayakawa .................... | 372/45 |
| 5,289,484 A | | 2/1994 | Hayakawa .................... | 372/45 |
| 5,594,749 A | | 1/1997 | Behfar-Rad et al. ......... | 372/45 |
| 5,815,521 A | | 9/1998 | Hobson et al. ............... | 372/45 |

FOREIGN PATENT DOCUMENTS

| | | | | |
|---|---|---|---|---|
| EP | 0 790 685 B1 | 7/2001 | ............. | H01S/5/32 |
| WO | WO 96/08062 | 3/1996 | ............. | H01S/3/19 |

OTHER PUBLICATIONS

Andrzej Malag et al., MOVPE–grown (AlGa) As double–barrier multiquantum well (DBMQW) laser diode with low vertical beam divergence, *Journal of Crystal Growth*, vol. 170, 1997, pp. 408–412, no mont available.

Jürgen Sebastian et al., High–Power 810–nm GaAsP–AlGaAs Diode Lasers With Narrow Beam Divergence, *IEEE Journal on Selected Topics in Quantum Electronics*, vol. 7, No. 2, Mar./Apr. 2001, pp. 334–339.

J. Temmyo et al., Design of high–power strained InGaAs/AlGaAs quantum–well lasers with a vertical divergence angle of 18°, *Electronics Letters*, vol. 31, No. 8, Apr. 13, 1995, pp. 642–644.

V. Vusirkala et al., GaAs–AlGaAs QW Diluted Waveguide Laser with Low–Loss, Alignment–Tolerant Coupling to a Single–Mode Fiber, *IEEE Photonics Technology Letters*, vol. 8, No. 9, Sep. 1996, pp. 1130–1132.

G. Iordache et al., High power CW output from low confinement asymmetric structure didode laser, *Electronics Letters*, vol. 35, No. 2, Jan. 21, 1999, pp. 148–149.

* cited by examiner

*Primary Examiner*—Quyen Leung
(74) *Attorney, Agent, or Firm*—Knobbe, Martens, Olson & Bear, LLP

(57) ABSTRACT

A diode laser formed by a plurality of layers including n-type layers and p-type layers, the plurality of layers having a substantially asymmetric refractive index profile with respect to the layer growth direction so as to generate an optical field distribution with a larger fraction in n-type layers than in p-type layers, and configured to generate a beam with a divergence of less than about 28° in the growth direction. The layers include an active layer for generating the optical field, a trap layer for attracting the optical field, and a separation layer between the active layer and the trap layer for repelling the optical field. The laser can be configured to have an internal loss of about 1.2 cm$^{-1}$ or less, and to generate a laser beam with a spot size of at least about 1.1 µm and a divergence of approximately 13° in the growth direction. If the length of the laser is at least about 1 mm, the threshold current density of the laser can be less than about 400 A cm$^{-2}$.

23 Claims, 5 Drawing Sheets

LOW DIVERGENCE DIODE LASER

FIELD OF THE INVENTION

The present invention relates to a low divergence diode laser.

BACKGROUND

Edge-emitting diode lasers generally produce laser beams with an elliptical cross-section and a large divergence in the growth direction, i.e., perpendicular to the substrate upon which the layers of the laser are grown. For example, semiconductor quantum well lasers with output wavelengths of about 870–980 nanometers (nm) generally have an optical field distribution spot size of approximately 0.4–0.6 micrometer ($\mu$m), while the size of the quantum well in the growth direction is only about 6–10 nm. Light with wavelengths of about 870–980 nm is thus strongly diffracted, producing a large beam divergence of approximately 30–40° in the growth or transverse (vertical) direction. This large beam divergence degrades the coupling efficiency of the laser diode with single mode optical fibers. There is therefore a need for efficient diode lasers with transverse beam divergences of at most about 20–30°.

The beam divergence of a diode laser can be reduced by spreading the optical field over a larger range of depths with respect to the substrate or growth direction. However, the optical field is restricted by waveguiding resulting from confinement layers located above and below the active layer containing the quantum wells from which photons are emitted. These confinement layers are generally about 1–1.5 $\mu$m thick and their refractive index is lower than the refractive index of the active layer. If the optical field distribution is spread, the thickness of these confinement layers usually needs to be increased correspondingly because the decay of the optical field distribution in these confinement layers should be large enough to prevent significant leakage into the high refractive index, high loss $n^{++}$ GaAs substrate, $p^{++}$ GaAs contact layer and metal layers. Performance parameters such as internal loss, efficiency and threshold current are degraded by optical leakage into such lossy layers. However, the thickness of the confinement layers is limited by the total thickness that can be practically grown. For example, extremely thick layers tend to develop undesirable morphological features such as pinholes, and undulations, and suffer from particulate contamination. Moreover, thick layers generally have unacceptably high series resistance.

It is desired, therefore, to provide a diode laser with a transverse beam divergence of less than about 28° that alleviates one or more difficulties of the prior art, or at least to provide a useful alternative to existing diode lasers.

SUMMARY OF CERTAIN INVENTIVE ASPECTS

In accordance with one aspect of the present invention, there is provided a diode laser formed by a plurality of layers including n-type layers and p-type layers, the plurality of layers having a substantially asymmetric refractive index profile with respect to a growth direction of the layers, so as to generate an optical field having a distribution with a larger fraction in n-type layers than in p-type layers of the laser, and the plurality of layers being configured to generate a beam with a divergence of less than about 28° in the growth direction.

Preferably, the plurality of layers includes an active layer for generating the optical field, a trap layer for attracting the optical field, and a separation layer between the active layer and the trap layer for repelling the optical field.

Preferably, the length of the laser is at least about 1 mm, and the plurality of layers is configured so that the threshold current density of the laser is less than about 400 Amp per centimeter squared (A cm$^{-2}$).

In another aspect of the invention, the plurality of layers is configured to generate a beam with a transverse divergence of at most about 17° and a spot size of at least about 0.8 $\mu$m, the laser having an internal loss of approximately 1.5 cm$^{-1}$ or less.

In still another aspect of the invention, the plurality of layers is configured to generate a beam with a transverse divergence of at most about 13° and a spot size of at least about 1.1 $\mu$m, the laser having an internal loss of approximately 1.2 cm$^{-1}$ or less.

Various preferred embodiments of the present invention improve on the prior art by including an asymmetric layer structure around the active region, such that a larger fraction of the optical field is in the n-type layers of the structure below the active region than is in the p-type layers above the active region, and configured to provide a low transverse beam divergence. These embodiments can be designed to have a low internal loss, a reasonably low threshold current density and a relatively large spot size to allow for high power operation.

Certain preferred embodiments of the present invention generally exhibit threshold current densities of about 300–370 A cm$^{-2}$, depending on device length. The spot size of the beam generated by the laser is approximated by d/$\Gamma$, where d is the quantum well width, and $\Gamma$ is the confinement factor. A spot size is $\approx$1 $\mu$m, compared with values of approximately 0.4–0.6 $\mu$m for prior art structures designed for high power operation, thus conferring a higher resistance to catastrophic optical damage (COD). Lasers produced in accordance with the invention are particularly suited for high power applications such as materials processing, medicine, and optical communications, such as 980 nm pump lasers for Er-doped fiber amplifiers.

BRIEF DESCRIPTION OF THE DRAWINGS

Preferred embodiments of the present invention are hereinafter described, by way of example only, with reference to the accompanying drawings, wherein.

DETAILED DESCRIPTION OF CERTAIN INVENTIVE EMBODIMENTS

Figure 1:
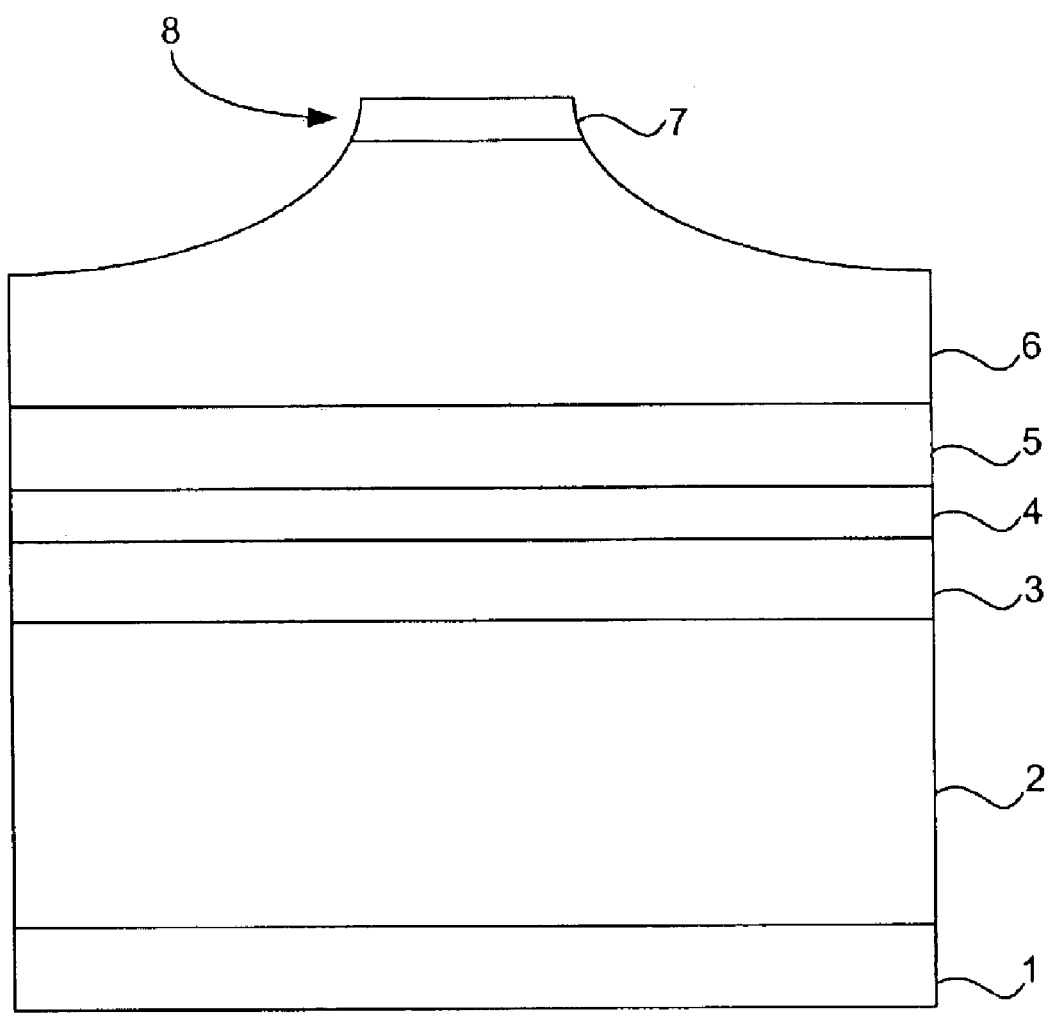
FIG. 1 is a schematic cross-section diagram of a first preferred embodiment of a ridge diode laser in accordance with the present invention.

A ridge diode laser, as shown in the cross-section view of FIG. 1, includes an active layer 5 for generating an optical field, and an optical trap layer 3 for attracting the optical field away from the active layer 5. A separation layer 4 between the active layer 5 and the trap layer 3 repels the optical field. These three layers 3 to 5 are located between a top p-type confinement layer 6 and a bottom n-type confinement layer 2 which repel the optical field to confine it to the inner layers 3 to 5. The net result of this layer structure is an asymmetric optical field distribution, which can be designed to provide the laser with desirable characteristics, as described below.

Electrical contact to the laser is facilitated by a $p^{++}$ GaAs contact layer 7. The layers 2 to 7 are grown on an $n^{++}$ GaAs substrate wafer 1 by a suitable epitaxial method such as metal-organic chemical vapor deposition (MOCVD), molecular beam epitaxy (MBE), or chemical beam epitaxy (CBE). Table 1 provides more detail of the diode laser structure, including the purpose, composition, thickness, conductivity type, doping concentration and confinement factor $\Gamma$ of each layer, including spacer and grading layers not shown in FIG. 1. With the exception of the $In_{0.2}Ga_{0.80}As$ quantum wells in the active layer 5, the compositions are indicated by the fractional content x of Al in the grown $Al_xGa_{1-x}As$ layers.

After growing these layers 2 to 7, a ridge structure 8 is fabricated by masked chemical etching through the GaAs contact layer 7 and part of the p-type confinement layer 6 to produce an elongated ridge 8 with a width of about 50 $\mu$m and a length (into the page in FIG. 1) of approximately 1–2 millimeters (mm). However, it will be appreciated that the width and length of the ridge 8 can be selected according to the desired characteristics of the laser. For example, in the case of ridge diode lasers operating at about 980 nm, ridge widths of approximately 2–4 $\mu$m are used to fabricate single mode lasers, whereas ridge widths of about 50–200 $\mu$m are used to fabricate multi-mode lasers. Similarly, ridge lengths greater than about 1 mm are preferable for high power lasers to achieve greater cavity gain relative to mirror losses, whereas shorter ridge lengths can be used for lasers operating at relatively low powers.

TABLE 1

| layer number | layer type | Al content | thickness ($\mu$m) | type | doping ($cm^{-3}$) | conf. factor $\Gamma$ |
|---|---|---|---|---|---|---|
| 7 | $p^{++}$ contact | 0.00 | 0.10 | $p^{++}$ | $>5 \times 10^{18}$ | $8.61 \times 10^{-6}$ |
| 6 | p confinement | 0.43 | 1.40 | p | $5 \times 10^{17}$ | $2.22 \times 10^{-2}$ |
|   | p confinement | 0.43 | 0.60 | p | $2 \times 10^{17}$ | $1.55 \times 10^{-1}$ |
|   | p confinement | 0.60 | 0.01 | p | $2 \times 10^{17}$ | $1.48 \times 10^{-1}$ |
| 5 | grading | 0.60→0.20 | 0.16 | — | undoped | $2.17 \times 10^{-3}$ |
|   | spacer | 0.00 | 0.0018 | — | undoped | $2.17 \times 10^{-3}$ |
|   | active $In_{0.20}Ga_{0.80}As$ | | 0.006 | — | undoped | $7.28 \times 10^{-3}$ |
|   | spacer | 0.00 | 0.0018 | — | undoped | $2.19 \times 10^{-3}$ |
|   | barrier | 0.20 | 0.006 | — | undoped | $7.3 \times 10^{-3}$ |
|   | spacer | 0.00 | 0.0018 | — | undoped | $2.19 \times 10^{-3}$ |
|   | active $In_{0.20}Ga_{0.80}As$ | | 0.006 | — | undoped | $7.28 \times 10^{-3}$ |
|   | spacer | 0.00 | 0.0018 | — | undoped | $2.18 \times 10^{-3}$ |
|   | grading | 0.20→0.60 | 0.16 | — | undoped | $1.47 \times 10^{-1}$ |
| 4 | separation | 0.60 | 0.10 | n | $2 \times 10^{17}$ | $5.67 \times 10^{-2}$ |
|   | grading | 0.33→0.60 | 0.02 | n | $2 \times 10^{17}$ | $1.1 \times 10^{-2}$ |
| 3 | optical trap | 0.33 | 0.22 | n | $2 \times 10^{17}$ | $1.43 \times 10^{-1}$ |
|   | grading | 0.42→0.33 | 0.01 | n | $2 \times 10^{17}$ | $6 \times 10^{-3}$ |
| 2 | n confinement | 0.42 | 1.00 | n | $2 \times 10^{17}$ | $2.37 \times 10^{-1}$ |
|   | n confinement | 0.42 | 2.30 | n | $10^{18}$ | $2.71 \times 10^{-2}$ |
| 1 | $n^{++}$ substrate | 0.00 | | $n^{++}$ | | |

Figure 2:
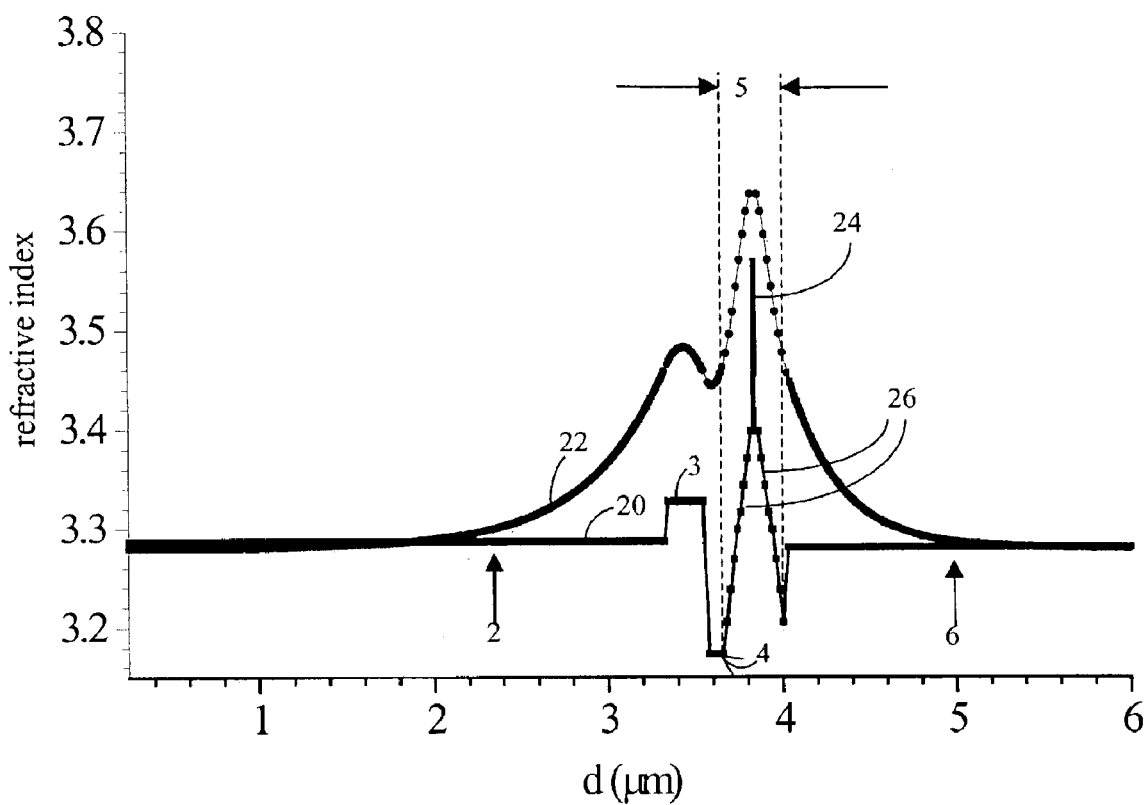
FIG. 2 is a graph of the optical field distribution and refractive index as a function of depth in a laser of the first preferred embodiment.

The depth profiles of refractive index 20 and optical field distribution 22 in the diode laser are shown as a function of total growth thickness in FIG. 2. The asymmetrical layer structure around the active layer 5 produces an asymmetric refractive index profile 20. In general, regions of relatively high refractive index attract the optical field, whilst regions of relatively low refractive index repel or guide the optical field away into higher refractive index layers. The reference numerals labelling various portions of the refractive index profile 20 are those of the corresponding layers shown in FIG. 1. The region from about 4–6 $\mu$m in FIG. 2 corresponds to the approximately 2 $\mu$m thick p-type $Al_{0.43}Ga_{0.57}As$ confinement layer 6, with a constant refractive index near 3.28. Below this layer, the refractive index profile of the approximately 0.35 $\mu$m undoped active region 5 includes narrow spikes 24 of high refractive index corresponding to the active $In_{0.2}Ga_{0.80}As$ quantum wells, surrounded by graded index regions 26. The layers 1 to 4 below the active region 5 are n-type layers. The layer 4 immediately below the active region 5, near a thickness value of about 3.6 $\mu$m in FIG. 2, is the approximately 0.1 $\mu$m thick $Al_{0.6}Ga_{0.4}As$ separation layer 4. The relatively low refractive index value of this layer, near 3.18, effectively repels the optical field distribution into adjacent layers. Beneath the separation layer 4, at thickness values of approximately 3.3–3.5 $\mu$m, is the approximately 0.22 $\mu$m thick $Al_{0.33}Ga_{0.67}As$ optical trap layer 3, with a relatively high refractive index value of approximately 3.33. The high refractive index of this trap layer 3 attracts or traps the optical field. Beneath this is the approximately 3.3 $\mu$m $Al_{0.42}Ga_{0.58}As$ n-type confinement layer 2, with a constant refractive index near 3.28, substantially equal to that of the p-type confinement layer 6.

The corresponding optical field depth distribution 22 within the laser, as shown in FIG. 2, is quite broad, with a total extent of about 6 $\mu$m in the layer growth direction. The asymmetric refractive index profile 20 produces an asymmetric optical field distribution 22 that includes strong peaks in the active region 5 and the trap layer 3. In particular, the optical field distribution 22 is mostly spread in the n-type layers 2 to 4 of the laser and less spread in the p-type layers 6,7. This broad, asymmetric optical field distribution has two beneficial aspects: first, the optical loss of the laser is reduced by skewing the field to the n-type layers 2 to 4 of the structure because free carrier absorption by electrons is about half that of holes. Second, the series resistance of the diode laser is largely determined by the p-type layers 6,7 because the mobility of holes is significantly lower than that of electrons. Consequently, the effect of skewing the optical field out of the p-type layers 6,7 and into the n-type layers 2 to 4 is to lower the series resistance of the laser. Thus, in contrast to prior art diode lasers, the optical field distribution is spread in the transverse direction with reduced intrinsic optical loss and/or series resistance.

In addition, the asymmetric structure is suited to high power operation. This is important because high power laser diodes, such as those emitting laser radiation at about 980 nm for pumping applications, operate very close to the power threshold for catastrophic optical mirror damage (COD). The lifetime of a diode laser critically depends on how close it operates to the COD threshold, which is directly proportional to the optical spot size. The spreading of the optical field naturally increases the spot size, thus increasing the power threshold for COD. The challenge is to increase the spot size in such a way that the corresponding increase of the threshold current density is tolerable for high power operation. In conventional structures optimised for high power operation, the typical spot size is about 0.4–0.6 $\mu$m and the corresponding transverse divergence is approximately 28–30°. In conventional structures designed for low threshold operation, the divergence increases to values of about 30–40° due to the tighter confinement of the light around the active region. For the asymmetric diode laser structure of Table 1, the spot size is given by d/$\Gamma$=0.82 $\mu$m, where d, and $\Gamma$ are the thickness and the confinement factor of the active region 5, respectively. Thus, the structure is suited to high power operation. Moreover, the transverse divergence of the laser is only about 17°. This low divergence is suitable for coupling the laser to optical fibers without incurring significant coupling losses.

Figure 3:
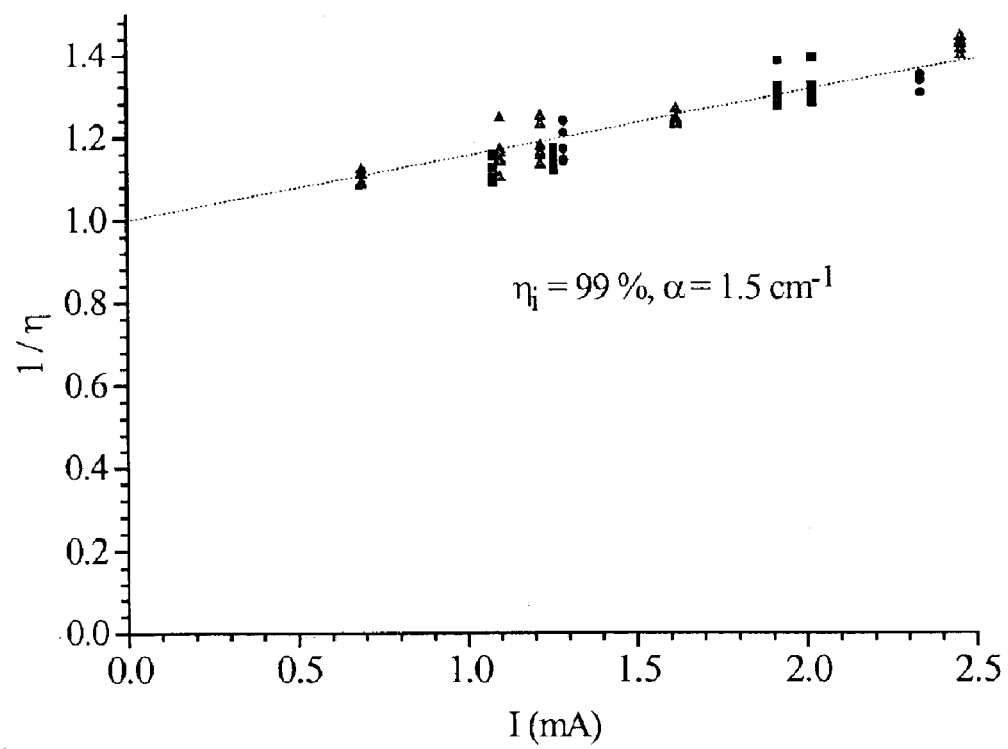
FIG. 3 is a graph of the reciprocal of the differential efficiency $\eta_{ext}$ of lasers produced in accordance with the first preferred embodiment as a function of their length.

The differential efficiency of a diode laser is defined as $$\eta_{ext} = \frac{dP}{dI} E_g \eta_{int},$$

where P is the laser output power, I is the laser drive current, $$\frac{dP}{dI}$$

is the slope of the optical power output versus injection current graph, $E_g$ is the band gap, and $\eta_{int}$ is the internal quantum efficiency, which is ~100%. A number of diode lasers were fabricated with different ridge lengths but having the layer structure of Table 1. FIG. 3 is a graph of $$\frac{1}{\eta_{ext}},$$

the reciprocal of differential efficiency of the lasers, as a function of ridge length. The slope of the straight line 30 fit to the data points for individual devices corresponds to an internal loss of only about 1.5 cm$^{-1}$. This low loss value makes possible the use of relatively long (e.g., approximately 1.5–2 mm) devices having reasonable efficiencies. Long devices are preferred because they have higher kink-free power operation than shorter devices due to reduced carrier anti-guiding and thermal effects.

Figure 4:
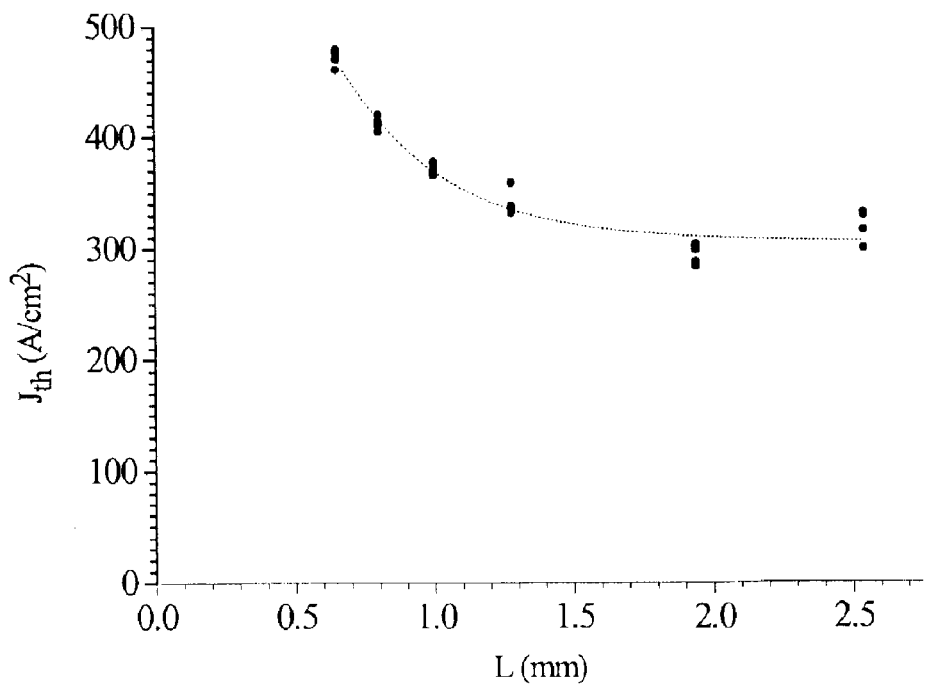
FIG. 4 is a graph of the threshold current density of lasers produced in accordance with the first preferred embodiment as a function of their length.

FIG. 4 is a graph of the threshold current density of the lasers as a function of their length. The threshold current densities of lasers with lengths of about 1.5–2 mm are in the range of about 300–360 A cm$^{-2}$. As expected, this is higher than the typical value of about 200 A cm$^{-2}$ for prior art lasers with small spot sizes, due to the lower confinement in the active region. However, these higher threshold current densities are acceptable for high power operation, for which in general values of operating current density are as high as about 3000–4000 A cm$^{-2}$.

Figure 5:
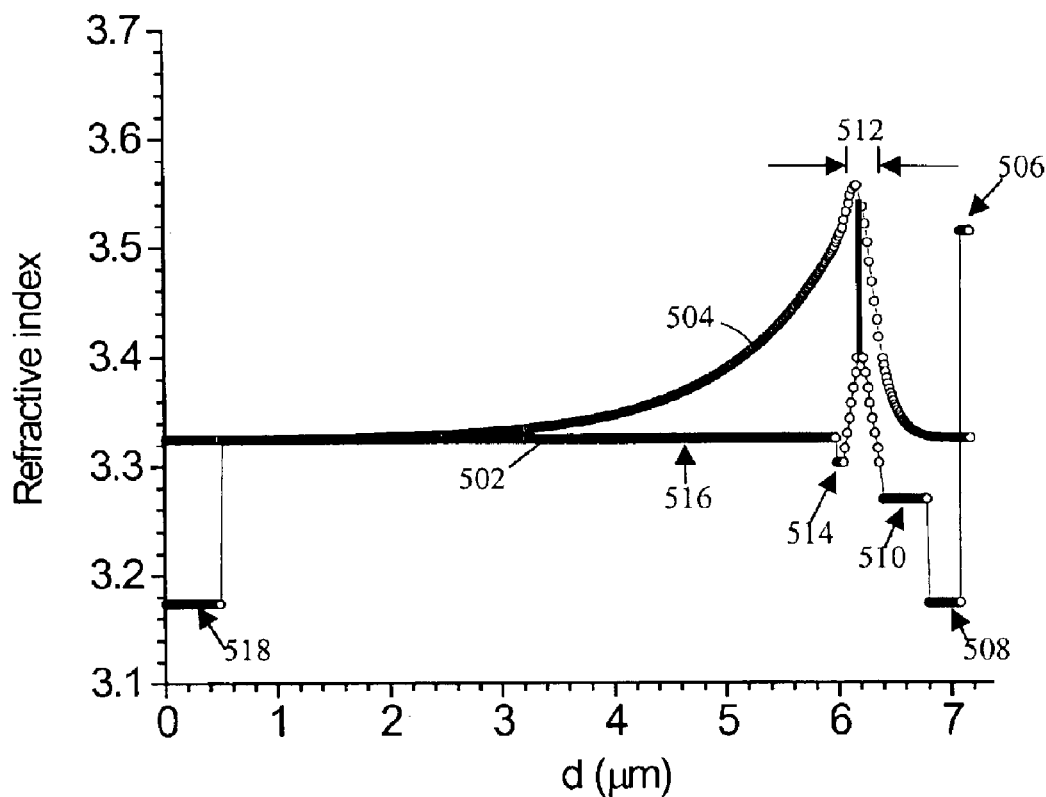
FIG. 5 is a graph of the optical field distribution and refractive index as a function of depth in a second preferred embodiment of a ridge diode laser in accordance with the present invention.

In an alternative embodiment, an even lower transverse beam divergence is obtained by a ridge diode laser having the layer structure of Table 2. The depth profiles of refractive index 502 and optical field distribution 504 in the diode laser are shown as a function of total growth thickness in FIG. 5. The rightmost feature of the refractive index profile 502 corresponds to an approximately 0.1 $\mu$m p$^{++}$ GaAs contact layer 506, having a refractive index of approximately 3.52. Below this is an approximately 0.60 $\mu$m p-type $Al_{0.6}Ga_{0.4}As$ confinement layer 508, having the lowest value of refractive index, near 3.18, strongly repelling the optical field. The next layer is an approximately 0.4 $\mu$m p-type $Al_{0.45}Ga_{0.55}As$ confinement or waveguide layer 510, with a moderate refractive index value near 3.28. Below this is the active layer 512, with grading and spacer layers around and between the two $In_{0.2}Ga_{0.8}As$ quantum wells used to generate 980 nm radiation. Under the active layer 512 is an approximately 0.05 $\mu$n-type $Al_{0.375}Ga_{0.625}As$ separation layer 514 for repelling the optical field distribution into the adjacent approximately 5.5 $\mu$m n-type $Al_{0.333}Ga_{0.667}As$ optical trap layer 516. Finally, an approximately 0.4 $\mu$m n-type $Al_{0.6}Ga_{0.4}As$ confinement layer 518, having approximately the same refractive index value as the top p-type confinement layer 508, reduces the spread of the optical field distribution into the underlying n$^{++}$ substrate 1.

The resulting optical field distribution 504 has a single peak at approximately the depth of the two quantum wells in the active layer 512. The peak is sharply defined towards the p-type layers 506 to 510, with a much broader, exponential-like tail in the thick n-type trap layer 516. It will be apparent that the low refractive index values of the top p-type confinement layer 508 and the bottom n-type confinement layer 518 confine the optical field distribution to the intermediate layers 510 to 516. In comparison with the first embodiment shown in FIG. 2, the active layer 512 is much closer to the top p$^{++}$ contact layer 506, and thus the extremely low refractive index value of the p-type confinement layer 508 is used to strongly repel the optical field distribution 504 away from the p$^{++}$ contact layer 506 to reduce absorption loss. The reduced thickness of the p-type confinement layers 508, 510 also facilitates etching, compared with the approximately 2 micron thick p-type confinement layer 6 of the first embodiment.

TABLE 2

| layer | layer type | Al content | thickness ($\mu$m) | type | doping (cm$^{-3}$) | Conf. factor |
|---|---|---|---|---|---|---|
| 506 | p$^{++}$ contact | 0.00 | 0.10 | p$^{++}$ | >5 × 10$^{19}$ | 8.86e−6 |
| 508 | p-confinement | 0.60 | 0.30 | p | 5 × 10$^{17}$ | 6.138e−4 |
| 510 | waveguide | 0.45 | 0.40 | p | 1 × 10$^{17}$ | 3.673e−2 |
| 512 | spacer | 0.40 | 0.01 | — | undoped | 3.314e−3 |
|  | grading | 0.20→0.375 | 0.16 | — | undoped | 9.755e−2 |
|  | spacer | 0.00 | 0.0018 | — | undoped | 1.583e−3 |
|  | active In$_{0.20}$Ga$_{0.80}$As | x$_{In}$ = 0.20 | 0.006 | — | undoped | 5.330e−3 |
|  | spacer | 0.00 | 0.0018 | — | undoped | 1.613e−3 |
|  | barrier | 0.20 | 0.006 | — | undoped | 5.415e−3 |
|  | spacer | 0.00 | 0.0018 | — | undoped | 1.635e−3 |
|  | active In$_{0.20}$Ga$_{0.80}$As | x$_{In}$ = 0.20 | 0.006 | — | undoped | 5.479e−3 |
|  | spacer | 0.00 | 0.0018 | — | undoped | 1.650e−3 |
|  | grading | 0.375→0.20 | 0.16 | — | undoped | 1.372e−1 |
| 514 | separation | 0.375 | 0.05 | — | undoped | 3.62e−2 |
| 516 | optical trap | 0.333 | 2.75 | n | 5 × 10$^{16}$ | 6.368e−1 |
|  | optical trap | 0.333 | 2.75 | n | 5 × 10$^{17}$ | 2.864e−2 |
| 518 | n-confinement | 0.60 | 0.40 | n | 5 × 10$^{17}$ | 4.31e−6 |
| 1 | n++ substrate | 0.00 |  | n$^{++}$ |  | 1.47e−4 |

Figure 6:
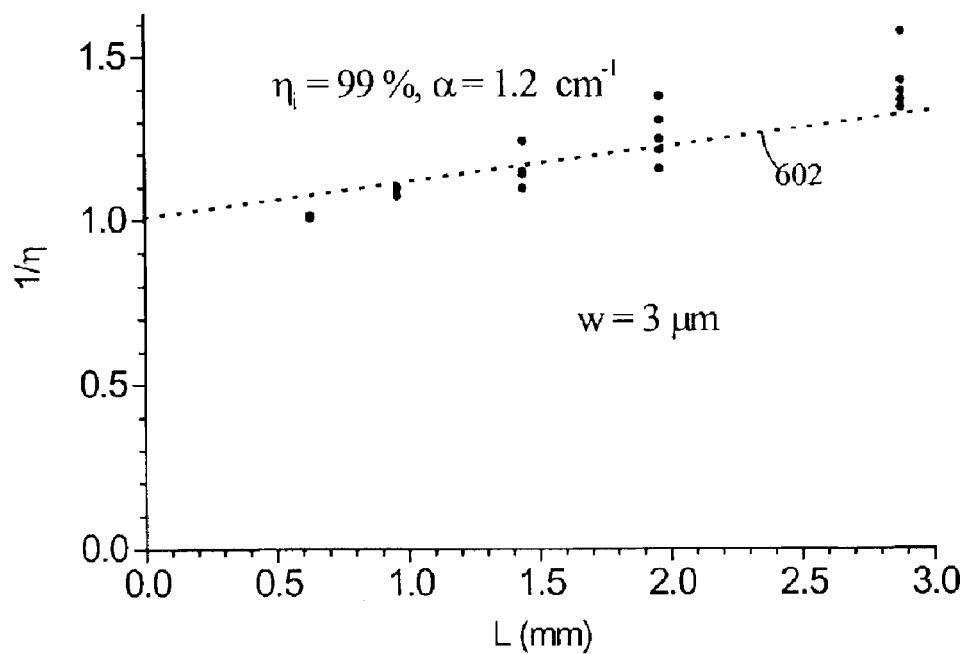
FIG. 6 is a graph of the reciprocal of the differential efficiency $\eta_{ext}$ of lasers produced in accordance with the second preferred embodiment as a function of their length.

FIG. 6 is a graph of $$\frac{1}{\eta_{ext}},$$

the reciprocal of differential efficiency of ridge diode lasers having the layer structure of Table 2 as a function of ridge length. The slope of the straight line fit 602 to the data points for individual devices corresponds to an internal loss of only about 1.2 cm$^{-1}$, substantially lower than the internal loss of diode lasers having the layer structure of Table 1.

Figure 7:
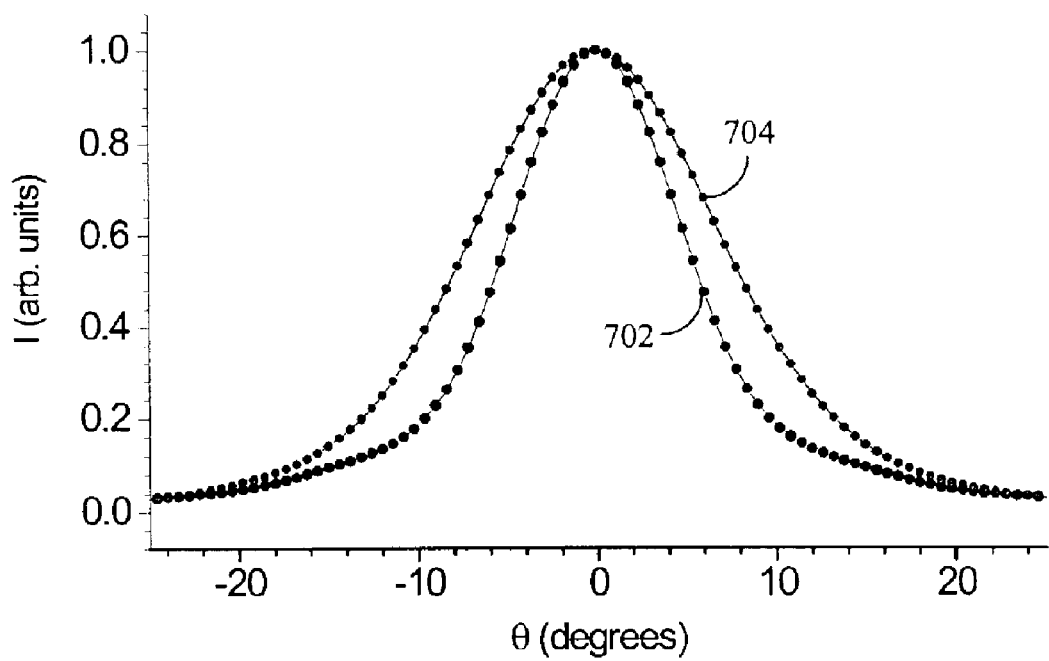
FIG. 7 is a graph of the far-field optical output intensity generated by lasers of the first and second preferred embodiments as a function of transverse emission angle.

FIG. 7 is a graph of the far-field optical output intensity generated by the first and second preferred embodiments as a function of transverse emission angle. The far-field optical distribution 702 of the laser having the layer structure of Table 2 corresponds to a transverse divergence angle of only ≈13°, comparing well with the calculated value of ≈12°. This beam divergence is substantially lower than the value of about 17° for the optical field distribution 704 of lasers having the layer structure of Table 1, providing a further improvement in coupling efficiency. In the second preferred embodiment, the spot size of the laser beam is somewhat larger, at d/Γ≈1.11 $\mu$m, indicating that it has an even higher resistance to catastrophic optical damage than lasers of the first preferred embodiment. The threshold current densities of lasers of both preferred embodiments are similar, despite the difference in spot size.

The characteristics of the lasers described above are determined by the particular asymmetric layer structures shown in Tables 1 and 2. However, it will be apparent to one skilled in the art that many possible asymmetric layer structures can be used to provide a diode laser with low transverse beam divergence, and preferably also with low loss and large spot size. Due to the complex nature of diode laser physics, it is not generally possible to define strict rules for determining which layer structures will provide the desired characteristics for a given application. For example, a structure with low confinement does not necessarily produce a laser beam with low divergence. Ultimately, the characteristics of a particular layer structure may be simulated using standard transfer matrix calculations, as described for example in K. H. Schlereth and M. Tacke, *The Complex Propagation of Multilayer Waveguides: an Algorithm for a Personal Computer*, IEEE Journal of Quantum Electronics, Vol. 26, p. 627 (1990) ("Schlereth").

Notwithstanding the above, it is possible to state a number of design guidelines that can be used to reduce the time required to design a laser structure with good performance characteristics, such as the structure of the preferred embodiment. For example, the following procedure can be used to determine a suitable structure:

(i) Design an asymmetric layer structure for the diode laser. In addition to an active layer for generating the optical field, the structure preferably includes a trap layer for attracting the optical field, and a separation layer of very low refractive index between the active layer and the trap layer for repelling the optical field. Additional trap layers can, of course, be included, but a simple structure is generally preferred, to reduce the number of (absorptive) layer interfaces, for example.

(ii) Include at least one trap layer of high refractive index to skew the optical distribution away from p-type layers and towards n-type layers of the structure. However, the refractive index of the trap layer should not be so high relative to the refractive index of the active layer as to result in a high degree of recombination in the trap layer. This would decrease recombination in the active layer, reducing gain and increasing the threshold current of the laser, which is preferably less than 400 A cm$^{-2}$.

(iii) Ensure that the asymmetric structure is not so asymmetric that it does not support the fundamental mode at the operating wavelength of the laser. This can be achieved by selecting layer parameters to support the fundamental mode, based on numeric modelling of the structure, as described for example in Schlereth. Moreover, the fundamental mode should be sufficiently removed from cutoff that technological variations during fabrication are not likely to result in the fundamental mode being cutoff in practice.

(iv) Design the asymmetric layer structure to have low confinement. That is, the optical field distribution should not be too narrow in the growth direction. It will be apparent to one skilled in the art that it is not practical to define this quantitatively due to the complex distributions that can be obtained from multi-layer structures. The spot size d/Γ is preferably at least about 0.8 $\mu$m.

(v) Include a confinement layer of low refractive index between the metal contact layer and the other layers of the structure to separate the optical field from the contact layer and metal contact, and thus reduce optical absorption in these layers, which is preferably less than about 0.3 cm$^{-1}$.

(vi) The configuration of the trap layer and the substrate should be such as to keep the optical field sufficiently removed from the substrate to avoid excessive absorption in the latter. A thick confinement layer of low refractive index can be used for this purpose. The optical loss in the substrate is preferably less than about 0.1 cm$^{-1}$.

(vii) The total internal loss in the laser is preferably 1.5 cm$^{-1}$ or better. This is determined by (v) and (vi) above, as well as the number of layer interfaces. Additionally, free carrier absorption at high injection levels contributes to the internal loss.

(viii) Bearing in mind the above guidelines, ensure that the beam divergence in the transverse (i.e., growth) direction is less than about 28°, preferably less than about 20°, and even more preferably, approximately 17° or less. As described above, this preferably involves transfer matrix simulation of the structure. If the divergence is too high, then the layer structure is adjusted (e.g., by reducing the confinement of the optical field by broadening a layer of high refractive index, or adding another layer of high refractive index) and the simulation repeated. This iterative procedure can be continued until the divergence is as low as desired.

Many modifications will be apparent to those skilled in the art without departing from the scope of the present invention as herein described with reference to the accompanying drawings.

What is claimed is:

1. A diode laser comprising:
an active layer for generating an optical field;
one or more p-type layers on a first side of said active layer;
a p-type contact layer for said one or more p-type layers; and
a plurality of n-type layers on a second, opposite side of said active layer, one of said plurality of n-type layers being a high refractive index layer having a refractive index higher than said one or more p-type layers and others of said plurality of n-type layers such that the fraction of said optical field in said plurality of n-type lay is larger than the fraction of said optical field in said one or more p-type layers, and one of said plurality of n-type layers being an n-type waveguide layer disposed between the active layer and the high refractive index layer having a lower refractive index than the active layer and the high refractive index layer,
wherein the refractive indices and thicknesses of said high refractive index layer and said n-type waveguide layer provide an output laser beam with a divergence of less t an about 28° in a direction transverse to said layers.

2. A diode laser as claimed in claim 1, wherein the thickness of said high refractive index layer is greater than the thickness of said n-type way guide layer.

3. A diode laser as claimed in claim 1, wherein said high refractive index layer is between said n-type waveguide layer and a second n-type layer having a refractive index lower than that of the high refractive index layer to repel the optical field.

4. A diode laser as claimed in claim 3, wherein the refractive index of said second n-type layer is greater than the refractive index of said n-type waveguide layer.

5. A diode laser as claimed in claim 1, wherein the length of the laser is at least about 1 mm, and said active layer includes one or more quantum wells having respective graded refractive index profiles that provide a threshold current density of less than about 400 A cm$^{-2}$.

6. A diode laser as claimed in claim 1, wherein the refractive indices and thicknesses of said n-type waveguide layer and said high refractive index layer have values that provide an output laser beam with a divergence of less than about 17° in a direction transverse to said layers.

7. A diode laser as claimed in claim 1, wherein the refractive indices and thicknesses of said n-type waveguide layer and said high refractive index layer have values that provide an internal loss for said laser of about 1.5 cm$^{-1}$ or less.

8. A diode laser as claimed in claim 1, wherein the refractive indices and thicknesses of said n-type waveguide layer and said high refractive index layer have values that yield a spot size of said beam of at least about 0.8 μm.

9. A diode laser as claimed in claim 1, wherein the refractive indices and thicknesses of said n-type waveguide layer and said high refractive index layer have values that provide an output laser beam with a divergence of at most about 13° in a direction transverse to said layers.

10. A diode laser as claimed in claim 1, wherein the refractive indices and thicknesses of said n-type waveguide layer and said high refractive index layer have values that provide an internal loss of said laser that is about 1.2 cm$^1$ or less.

11. A diode laser as claimed in claim 1, wherein the refractive indices and thicknesses of said n-type waveguide layer and said high refractive index layer have values that provide a spot size of said beam that is at least about 1.1 μm.

12. A diode laser as claimed in claim 3, wherein said high refractive index layer, said n-type waveguide layer, and said second n-type layer are the only n-type layers of said diode laser.

13. A diode laser as claimed in claim 6, wherein the refractive indices and thicknesses of said n-type waveguide layer and said high refractive index layer have values that provide an internal loss of said laser that is about 1.5 cm$^{-1}$ or less.

14. A diode laser as claimed in claim 6, wherein the refractive indices and thicknesses of said n-type waveguide layer and said high refractive index layer have values that provide a spot size of said beam that is at least about 0.8 μm.

15. A diode laser as claimed in claim 9, wherein the refractive indices and thicknesses of said n-type waveguide layer and said high refractive index layer have values that provide an internal loss of said laser that is about 1.2 cm$^{-1}$ or less.

16. A diode laser as claimed in claim 9, wherein the refractive indices and thicknesses of said n-type waveguide layer and said high refractive index layer have values that provide a spot size of said beam that is at least about 1.1 μm.

17. A diode laser as claimed in claim 6, wherein the thickness of said high refractive index layer is greater than the thickness of said n-type waveguide layer.

18. A diode laser as claimed in claim 6, wherein said high refractive index layer is between said n-type waveguide layer and a second n-type layer having a refractive index lower than that of the high refractive index layer to repel the optical field.

19. A diode laser as claimed in claim 1, wherein the laser includes only one p-type layer on said first side of said active layer, the refractive index and thickness of said p-type layer having values that produce reduced absorption of said optical field in said p-type contact layer.

20. A diode laser as claimed in claim 1, wherein the one or more p-type layers comprise a first p-type layer adjacent said active layer, and a second p-type layer between said first p-type layer and said p-type contact layer, and wherein the refractive index of said second p-type layer is substantially lower than the refractive index of said first p-type layer to repel said optical field and thereby to inhibit absorption of said optical field in said p-type contact layer.

21. A diode laser as claimed in claim 1, wherein said p-type contact layer is adjacent said one or more p-type layers.

22. A diode laser as claimed in claim 1, wherein the refractive index of said high refractive index layer is sufficiently high to attract the optical field away from the active layer and the lower refractive index of said n-type waveguide layer is sufficiently low to repel the optical field.

23. A diode laser comprising:
 an active layer for generating an optical field;
 a p-type region on a first side of said means for generating an optical field;
 means for electrically contacting said p-type region;
 an n-type region on a second, opposite side of said means for generating an optical field; and
 means for providing an output laser beam with a divergence of less than about 28° in a direction transverse to said layers.

* * * * *